US010110203B2

(12) United States Patent
Gupta et al.

(10) Patent No.: US 10,110,203 B2
(45) Date of Patent: Oct. 23, 2018

(54) TRI-STATE INVERTER, D LATCH AND MASTER-SLAVE FLIP-FLOP COMPRISING TFETS

(71) Applicant: COMMISSARIAT A L'ENERGIE ATOMIQUE ET AUX ENERGIES ALTERNATIVES, Paris (FR)

(72) Inventors: Navneet Gupta, Grenoble (FR); Adam Makosiej, Grenoble (FR); Costin Anghel, Vanves (FR); Amara Amara, Sceaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/454,405

(22) Filed: Mar. 9, 2017

(65) Prior Publication Data
US 2017/0264275 A1 Sep. 14, 2017

(30) Foreign Application Priority Data

Mar. 11, 2016 (FR) ...................................... 16 52056

(51) Int. Cl.
*H03K 3/3562* (2006.01)
*H03K 19/00* (2006.01)
(Continued)

(52) U.S. Cl.
CPC ......... *H03K 3/35625* (2013.01); *H03K 3/012* (2013.01); *H03K 3/038* (2013.01); *H03K 19/0002* (2013.01); *H03K 19/09429* (2013.01)

(58) Field of Classification Search
CPC .............. H03K 3/35625; H03K 3/038; H03K 19/09429; H03K 19/094; H03K 19/0941; H03K 3/012; H03K 19/0002
See application file for complete search history.

(56) References Cited

U.S. PATENT DOCUMENTS 9,685,222 B2 * 6/2017 Thomas ................ G11C 11/419
2015/0333534 A1 11/2015 Liu et al.
2017/0117885 A1 * 4/2017 Morris .............. H01L 29/66977

OTHER PUBLICATIONS

Costin Anghel, et al., "30-nm Tunnel FET With Improved Performance and Reduced Ambipolar Current" IEEE Transactions on Electron Devices, vol. 58, No. 6, Jun. 2011, pp. 1649-1654.
(Continued)

*Primary Examiner* — Jung Kim
(74) *Attorney, Agent, or Firm* — Oblon, McClelland, Maier & Neustadt, L.L.P.

(57) ABSTRACT

Tri-state inverter includes a n-TFET and a p-TFET, the drain of the n-TFET being connected to the drain of the p-TFET and to an output of the tri-state inverter, the gates of the n-TFET and p-TFET being connected to an input of the tri-state inverter, and a control circuit able to apply a first control voltage on the source of the n-TFET and a second control voltage on the source of the p-TFET, the values of the first and second control voltages being positive or zero, wherein, when the tri-state inverter is intended to work as an inverter, the value of the first control voltage is lower than the value of the second control voltage, and when the tri-state inverter is intended to be tri-stated, the value of the first control voltage is higher than the value of the second control voltage.

10 Claims, 8 Drawing Sheets

(51) Int. Cl.
    *H03K 3/012*          (2006.01)
    *H03K 3/038*          (2006.01)
    *H03K 19/094*        (2006.01)

(56) References Cited

OTHER PUBLICATIONS

Vinay Saripalli, et al., "An Energy-Efficient Heterogeneous CMP based on Hybrid TFET-CMOS Cores" Proceedings of the 48$^{th}$ Design Automation Conference, 2011, pp. 729-734.

French Preliminary Search Report dated Dec. 20, 2016 in French Patent Application No. 1652056 (with English translation of categories of cited documents).

Matthew Cotter, et al., "Evaluation of Tunnel FET-based Flip-Flop Designs for Low Power, High Performance Applications" 14$^{th}$ International Symposium on Quality Electronic Design, XP032418450, Mar. 4, 2013, pp. 430-437.

Daniel H. Morris, et al., "Design of Low Voltage Tunneling-FET Logic Circuits Considering Asymmetric Conduction Characteristics" IEEE Journal on Emerging and Selected Topics in Circuits and Systems, vol. 4, No. 4, Dec. 2014, pp. 380-388.

S. Richter, et al., "Tunnel-FET Inverters for Ultra-low Power Logic with Supply Voltage down to $V_\infty$=0.2 V" 15$^{th}$ International Conference on Ultimate Integration on Silicon (ULIS), XP032594315, Apr. 7, 2014, pp. 13-16.

\* cited by examiner

TRI-STATE INVERTER, D LATCH AND MASTER-SLAVE FLIP-FLOP COMPRISING TFETS

TECHNICAL FIELD AND PRIOR ART

The invention concerns a tri-state inverter, a D latch and a master-slave flip-flop comprising TFETs, which are able to address the requirements of ULP (Ultra-Low-Power) applications, like IoT (Internet of Things), while maintaining high performance.

Previous trends in System on Chip (SoC) design were focused on improving the performance of the system without giving significant consideration to power. Standard approach for performance improvement consisted in using bigger cores and multi-core CPUs. Technology scaling also helped in improving the performance. However, due to increased leakage with technology scaling, power consumption became an important parameter in design specification.

The development of energy efficient solutions is even more critical for IoT world which has an ever increasing demand for longer battery life while maintaining performance. Owing to the increasing importance of the IoT market, many reports were oriented towards an optimization of standby power for systems with low activity durations. Efforts were made to optimize dynamic power consumption at both system and circuit level using various circuit techniques, like dynamic voltage and frequency scaling (DVFS), power gating, and sacrificing area to provide less leakage while maintaining sufficient performance. DVFS is a particularly important technique in the IoT world due to the mode dependent operating frequency requirement, ranging from a few kHz to tens of MHz. Power reduction is considered at all phases of design including circuit, technology and system architecture levels. For example, to enable standby leakage reduction, power gated standard cells were proposed.

Other than CMOS technologies are also investigated in order to reduce power while maintaining performance.

The TFET ("Tunnel Field-Effect Transistor") is one of the promising alternatives to CMOS. Multicore architectures with CMOS/TFET heterogeneous cores in place of one CMOS core are proposed to reduce power consumption. A hybrid TFET-CMOS multiprocessor (CMP) chip design that uses CMOS cores for high performance and TFETs cores for low power was proposed in the document V. Saripalli et al., "An Energy-Efficient Heterogeneous CMP Based on Hybrid TFET-CMOS Cores", in Design Automation Conference (DAC), 2011, pp. 729-734. It is also known to use energy delay product aware DVFS technique with heterogeneous CMOS/TFET cores for improving energy efficiency. Power optimization is done at all levels from system architecture to individual components.

Flip-flops are critical components in any SoC design, especially for digital logic and microprocessor based systems where flip-flops are used as pipeline registers, register files and buffers. Even for a medium performance microprocessor, more than one thousand flip-flops are required for implementation. As of now, most of the designs are CMOS based, therefore flip-flops for MOSFETs are well explored for power and performance optimizations.

The document M. COTTER et al., "Evaluation of tunnel FET-based flip-flop designs for low power, high performance application", ISQED, 2013, discloses high performance low voltage TFET flip-flop. The designs of these flip-flops are similar to CMOS flip-flops. However, the reported leakage is more than those obtained in CMOS and FinFET implementations. This is mainly because the TFET devices used in the disclosed flip-flop are optimized for speed and provide higher $I_{ON}$ current at the cost of increased leakage.

More generally, the different designs of tri-state inverter, D-latch and master-slave flip-flop proposed in the literature have the drawbacks of requiring numerous transistors.

DESCRIPTION OF THE INVENTION

Thus there is a need to propose a new tri-state inverter, a new D latch and a new master-slave flip-flop requiring less transistors, and also enabling to obtain a new D latch and flip-flop architectures wherein the TFET characteristics are used in an optimum fashion, that is having lower leakages while being compatible with low power applications and without penalizing the operating speed of the flip-flop.

One embodiment of the invention proposes a tri-state inverter comprising at least:
  a first n-TFET and a first p-TFET, the drain of the first n-TFET being connected to the drain of the first p-TFET and to an output of the tri-state inverter, the gates of the first n-TFET and first p-TFET being connected to an input of the tri-state inverter;
  a control circuit able to apply a first control voltage on the source of the first n-TFET and a second control voltage on the source of the first p-TFET, the values of the first and second control voltages being positive or zero;
  and wherein the control circuit is configured to control the values of the first and second control voltages such that, when the tri-state inverter is intended to work, or function, as an inverter, the value of the first control voltage is lower than the value of the second control voltage, and when the tri-state inverter is intended to be tri-stated, the value of the first control voltage is higher than the value of the second control voltage.

Compared to a classical CMOS tri-state inverter requiring four MOS transistors, this new tri-state inverter requires only two TFET transistors. Thus this new tri-state inverter requires smaller area of semiconductor than a tri-state inverter made with more transistors, which enables to reduce the cost for making the tri-state inverter.

In addition, this tri-state inverter is implemented without device stacking, resulting in significant speed improvement at low voltages of operation.

The first control voltage may be a first clock signal oscillating between a high state and a low state, and the second control voltage may be a second clock signal which is complementary to the first clock signal. Thus, when the value of the first clock signal corresponds to a high state, the value of the second clock signal corresponds to a low state, and when the value of the first clock signal corresponds to a low state, the value of the second clock signal corresponds to a high state.

In this tri-state inverter, when it is intended to be tri-stated, the value of the first control voltage is higher than the value of the second control voltage such that the output of the tri-state inverter is insulated from the input of the tri-state inverter. This insulation is obtained thanks to the reverse biasing of the TFETs in this configuration leading to negative or zero gate-to-source voltage for the n-type TFET and positive or zero gate-to-source voltage for the p-type TFET. In the absence of ambipolarity, the above-mentioned conditions may completely block the TFET devices.

According to an alternative definition, it is proposed a tri-state inverter comprising at least:

a first n-TFET and a first p-TFET, the drain of the first n-TFET being connected to the drain of the first p-TFET and to an output of the tri-state inverter, the gates of the first n-TFET and first p-TFET being connected to an input of the tri-state inverter;

a control circuit able to apply a first control voltage on the source of the first n-TFET and a second control voltage on the source of the first p-TFET, the values of the first and second control voltages being positive or zero;

and wherein the control circuit is configured to apply, in a first configuration, the first control voltage having a value which is less than the value of the second control voltage such that the tri-state inverter works as an inverter wherein the output signal has a value which is complementary than that of the input signal, and to apply, in a second configuration, the first control voltage having a value which is higher than the value of the second control voltage such that the tri-state inverter is tri-stated.

A control method of a tri-state inverter is also proposed here, the tri-state inverter comprising a first n-TFET and a first p-TFET, the drain of the first n-TFET being connected to the drain of the first p-TFET and to an output of the tri-state inverter, the gates of the first n-TFET and first p-TFET being connected to an input of the tri-state inverter, wherein:

when the tri-state inverter is intended to work as an inverter, a first control voltage is applied on the source of the first n-TFET and a second control voltage is applied on the source of the first p-TFET, the values of the first and second control voltages being positive or zero and such that the value of the first control voltage is less than the value of the second control voltage;

when the tri-state inverter is intended to be tri-stated, the first control voltage applied on the source of the first n-TFET and the second control voltage applied on the source of the first p-TFET have positive or zero values and such that the value of the first control voltage is higher than the value of the second control voltage.

Another embodiment concerns a D latch comprising at least:

one tri-state inverter as above disclosed, the input of the tri-state inverter corresponding to an input of the D latch;

a latch comprising a second n-TFET, a second p-TFET and a storage node formed by the connection of the source of the second n-TFET to the source of the second p-TFET, an output of the D latch being connected to the storage node of the latch;

wherein the control circuit is able to apply:

the first control voltage on the gate of one of the second n-TFET and p-TFET, and the second control voltage on the gate of the other one of the second n-TFET and p-TFET;

a first supply voltage on the source of the second p-TFET and a second supply voltage on the source of the second n-TFET;

and wherein the first and second supply voltages are such that the second n-TFET and p-TFET are reverse biased in a state wherein a conduction current can be obtained by band-to-band tunneling in the second n-TFET and p-TFET. The conduction current is obtained when the second TFETs have a non-zero $V_{DS}$.

In such D latch, the memorization function is carried out by a latch comprising two TFETs and using NDR (Negative Differential Resistance) property of TFETs in reverse bias. Thus, the leakage power are considerably reduced compared to other architecture of D latch, and the energy required by the D latch is considerably reduced compared to the D latches of the prior art.

In addition, in view of the small number of transistors used in this D latch, the dynamic power consumption of the D latch is lower than that for the other D latches made with other architectures.

A control method of a D latch is also proposed, comprising at least:

one tri-state inverter as above disclosed, the input of the tri-state inverter corresponding to an input of the D latch;

a latch comprising a second n-TFET, a second p-TFET and a storage node formed by the connection of the source of the second n-TFET to the source of the second p-TFET, an output of the D latch being connected to the storage node of the latch;

and wherein:

a first control voltage is applied on the source of the first n-TFET and on the gate of one of the second n-TFET and p-TFET, a second control voltage is applied on the source of the first p-TFET and on the gate of the other one of the second n-TFET and p-TFET;

a first supply voltage is applied on the source of the second p-TFET;

a second supply voltage on the source of the second n-TFET;

and wherein the first and second supply voltages are such that the second n-TFET and p-TFET are reverse biased in a state wherein a conduction current can be obtained by band-to-band tunneling in the second n-TFET and p-TFET.

The difference between the values of the first and second supply voltages may be less than 0.6 V, for example between around 0.3 V and 0.6 V. However, these values may be outside the range 0.3 V-0.6 V, these values depending of the intrinsic features of the TFETs and also of the required operating conditions of the D latch.

Another embodiment proposes a master-slave flip-flop comprising at least first and second D latches as above described, wherein:

the output of the first D latch is connected to the input of the second D latch;

the input of the first D latch corresponds to an input of the master-slave flip-flop;

an output of the master-slave flip-flop is connected to the output of the second D latch;

the value of the first control voltage applied in the first D latch is equal to the value of the second control voltage applied in the second D latch; and the value of the second control voltage applied in the first D latch is equal to the value of the first control voltage applied in the second D latch.

Thus it is proposed an ultra-compact flip-flop design using TFETs compatible with ULP applications with long battery life time requirement while providing good performance.

As above explained for the D latch, such master-slave flip-flop uses NDR (Negative Differential Resistance) property of TFETs in reverse bias, leading to an important reduction of the leakage power compared to the other architectures of flip-flop, and also of the energy required. Indeed, at any given point of time, half of the TFETs in the master-slave flip-flop of the invention are in reverse bias condition, resulting in extremely low leakage current (<3 fA/flip-flop).

In addition, the small number of transistors used in this master-slave flip-flop (reduced by at least 50% in comparison to CMOS and FinFET implementations) enables to obtain a low dynamic power consumption. The less number of transistors leads to a low $C_{GS}$ of the TFETs and to a reduced area of semiconductor required for this master-slave flip-flop, thus lowering the cost of the flip-flop.

A control method of a master-slave flip-flop is also proposed, comprising at least first and second D latches as above described, wherein:
- the output of the first D latch is connected to the input of the second D latch;
- the input of the first D latch corresponds to an input of the master-slave flip-flop;
- an output of the master-slave flip-flop is connected to the output of the second D latch;
- the value of the first control voltage applied in the first D latch is equal to the value of the second control voltage applied in the second D latch; and
- the value of the second control voltage applied in the first D latch is equal to the value of the first control voltage applied in the second D latch.

This flip-flop, and thus also the D latch, is compatible with other CMOS components (driver, controller, etc.), allowing the implementation of heterogeneous cores within single CMOS process using both TFET and CMOS devices.

In addition, with neither feedback for latch implementation nor device stacking, the operating speed of this master-slave flip-flop is comparable or exceeds the speed of High-Performance FinFET implementation, especially for low voltage of operation where inverter delays are large.

The master-slave flip-flop may be such that:
- the first control voltage applied in the first D latch and the second control voltage applied in the second D latch is a first clock signal oscillating between a high state and a low state; and
- the second control voltage applied in the first D latch and the first control voltage applied in the second D latch is to a second clock signal which is complementary to the first clock signal.

Thus, when the value of the first clock signal corresponds to a high state, the value of the second clock signal corresponds to a low state, and when the value of the first clock signal corresponds to a low state, the value of the second clock signal corresponds to a high state. The value of the high state may correspond to the value of the first supply voltage and the value of the low state may correspond to the value of the second supply voltage.

The first clock signal may be used to generate the second clock signal, e.g. by using an inverter The master-slave flip-flop may further comprise a first inverter including at least a third n-TFET and a third p-TFET, the drain of said third n-TFET being connected to the drain of said third p-TFET and to an output of the first inverter, the gates of said third n-TFET and third p-TFET being connected to an input of the first inverter which is connected to the output of the second D latch, and the control circuit may be able to apply the first supply voltage on the source of said third p-TFET and the second supply voltage on the source of said third n-TFET. In such configuration, the master-slave flip-flop comprises only 12 TFETs (with another inverter comprising two TFETs generating the second clock signal from the first clock signal) and the output of the master-slave flip-flop corresponds to the output of the first inverter. The first inverter enables to isolate the internal storage latches from outside fan-out. In this configuration, the value of the output of the master-slave flip-flop and the value stored in the flip-flop, or the value of the output of the master-slave flip-flop and the value previously applied on the input of the master-slave flip-flop, are inverted.

The master-slave flip-flop may further comprise a second inverter including at least a fourth n-TFET and a fourth p-TFET, the drain of said fourth n-TFET being connected to the drain of said fourth p-TFET and to an output of the second inverter, the gates of said fourth n-TFET and fourth p-TFET being connected to an input of the second inverter which is connected to the output of the first inverter, and the control circuit may be able to apply the first supply voltage on the source of said fourth p-TFET and the second supply voltage on the source of said fourth n-TFET. In this configuration, the master-slave flip-flop comprises only 14 TFETS (with the other inverter comprising two TFETs generating the second clock signal from the first clock signal) and the output of the master-slave flip-flop corresponds to the output of the second inverter, that is the value of the output of the master-slave flip-flop corresponds to the value previously applied on the input of the master-slave flip-flop.

In each of the first and second D latches, the first control voltage may be applied on the gate of the second n-TFET and the second control voltage is applied on the gate of the second p-TFET. In this case, the master-slave flip-flop corresponds to a positive edge triggered flip-flop.

In each of the first and second D latches, the first control voltage may be applied on the gate of the second p-TFET and the second control voltage is applied on the gate of the second n-TFET. In this case, the master-slave flip-flop corresponds to a negative edge triggered flip-flop.

BRIEF DESCRIPTION OF THE DRAWINGS

This invention will be understood easier view of the examples of embodiments provided purely for indicative and non-limiting purposes, in reference to the appended drawings wherein.

Identical, similar or equivalent parts of the different figures described below have the same numeric references for the sake of clarity between figures.

The different parts shown in the figures are not necessarily drawn to scale, so as to make the figures more comprehensible.

The different possibilities (alternatives and embodiments) must not be understood to mutually exclude each other and can, thus, be combined with each other.

DETAILED DESCRIPTION OF PARTICULAR EMBODIMENTS

TFETs are reverse-biased p-i-n junctions that operate by tunneling effect, in which the electrostatic potential of the intrinsic region is controlled by a gate terminal. The TFETs used in the tri-state inverter, D latch and flip-flop described below are calibrated and designed on data similar to that disclosed in the documents C. ANGHEL et al., "30-nm Tunnel FET with improved performance and reduce ambipolar current", IEEE Transactions on Electron Devices, 2011.

For example:
the TFETs are built using Low-k ($SiO_2$) spacers and a High-k ($HfO_2$) gate dielectric;
the gate and the spacers lengths are 30 nm each;
the gate dielectric physical thickness is 3 nm;
the silicon film thickness (tSi) used to form the source, drain and channel regions is 4 nm.

Figure 1:
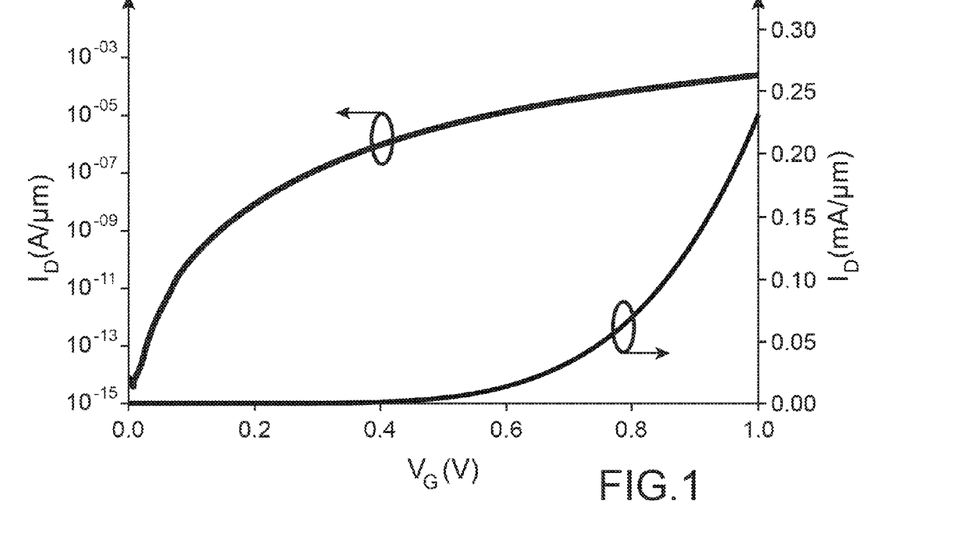
FIG. 1 shows the characteristic $I_D(V_{Ds})$ of a forward biased n-TFET.

The TFETs used in the tri-state inverter, D latch and flip-flop described below have a characteristic $I_D(V_G)$ in forward biasing condition as shown in FIG. 1. In this figure, the characteristic corresponds to the one of a n-TFET.

Figure 2:
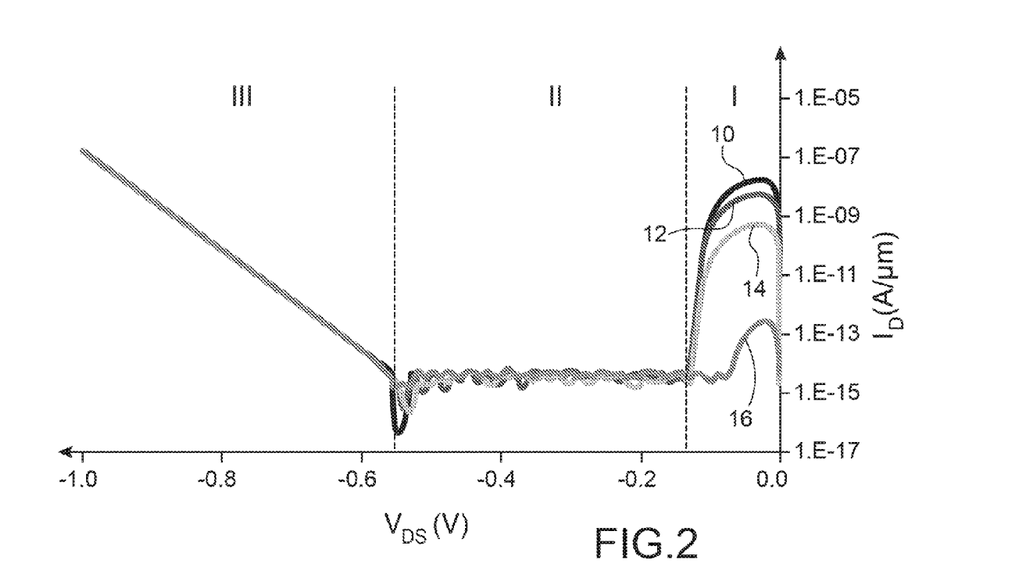
FIG. 2 shows the characteristic $I_D(V_{Ds})$ of a reverse biased n-TFET, for different values of $V_{is}$.
Figure 3A:
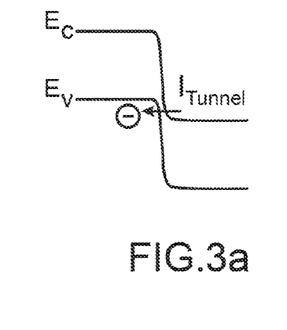
FIGS. 3a-3c show symbolically the different behaviors of a reverse biased TFET.
Figure 3B:
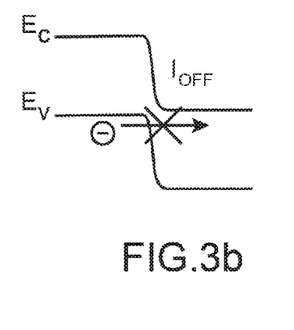
Figure 3C:
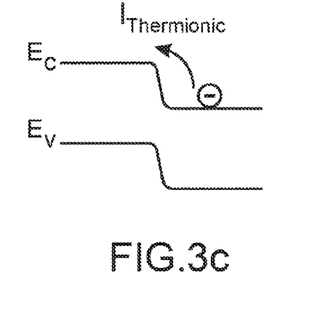

FIG. 2 shows the characteristic $I_D(V_{DS})$ of a reverse biased n-TFET, for different values of $V_{GS}$: $V_{GS}$=1 V for the curve 10, $V_{GS}$=0.75 V for the curve 12, $V_{GS}$=0.5 V for the curve 14 and $V_{GS}$=0.25 V for the curve 16. For this characteristic, three regions corresponding to three different behaviors of the TFET can be distinguished as follows:

Region I, which is named the "hump", wherein a conduction current $I_{Tunnel}$ is obtained in the TFET by band-to-band tunneling (the charge injection mechanism corresponding to the band-to-band tunneling is symbolically shown in FIG. 3a);

Region II, which is named the "flat-current region", wherein the conduction current obtained in the region I is no longer obtained due to the non-overlapping bands (as shown symbolically in FIG. 3b);

Region III, which is named the "p-i-n turn-on", wherein the charge injection mechanism is dominated by the thermionic emission over the barrier, creating a current named $I_{Thermionic}$ as shown symbolically in FIG. 3c. In this region III, the TFET has a behavior similar to a short-circuit.

For the region III, the reverse biased output characteristic is named "unidirectional" due to the fact that the gate loses the control over the n-TFET for high negative drain to source voltages and loses the control over the p-TFET for high positive drain to source voltages.

In the tri-state inverter, D latch and flip-flop described here, TFETs are not reverse biased with high negative $V_{DS}$ for n-TFET (and high-positive $V_{DS}$ for p-TFET) to avoid high leakage currents obtained in the region III, that is when the TFETs have a "p-i-n turn on" behavior.

Figure 4:
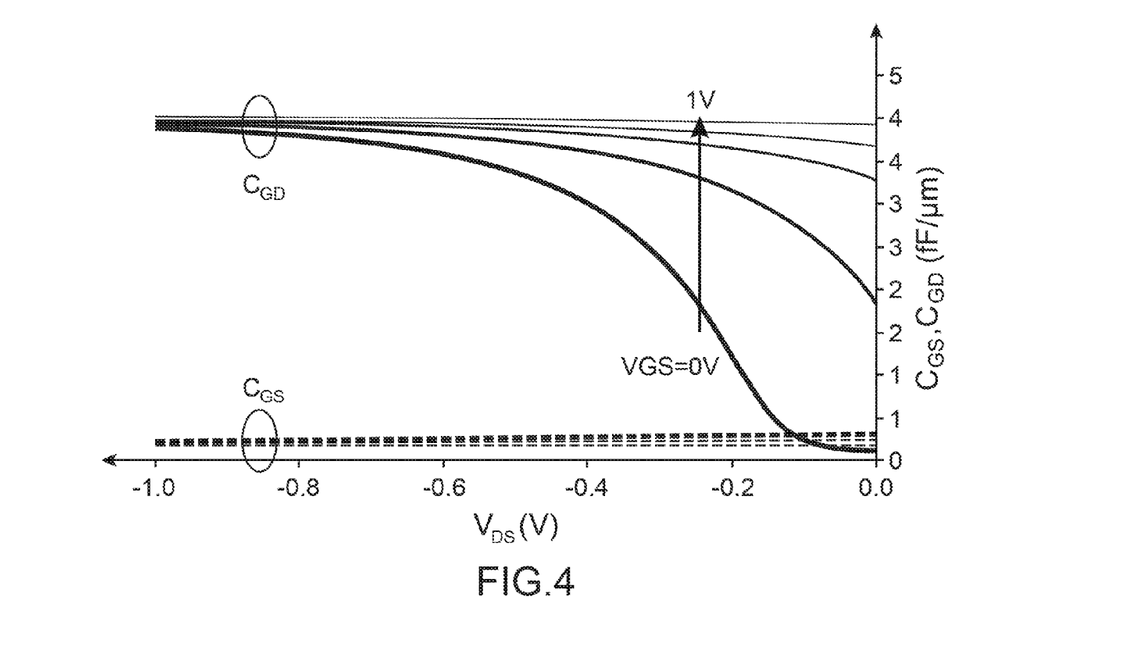
FIG. 4 shows TFET gate to source ($C_{GS}$) and gate to drain ($C_{GD}$) capacitances according to $V_{DS}$, obtained for different values of $V_{GD}$.

TFET gate to source ($C_{GS}$) and gate to drain ($C_{GD}$) capacitances are shown in FIG. 4. The $C_{GS}$ for TFETs is always low and has weak dependence on gate voltage. The total gate capacitance is dominated by $C_{GD}$.

For the following circuit simulations, both p-TFET and n-TFET are modelled using look-up tables. Both DC and capacitance characteristics were implemented as $I_D(V_{GS}, V_{DS})$, $C_{GS}(V_{GS},V_{DS})$, $C_{GD}(V_{GS},V_{DS})$ tables.

Figure 5:
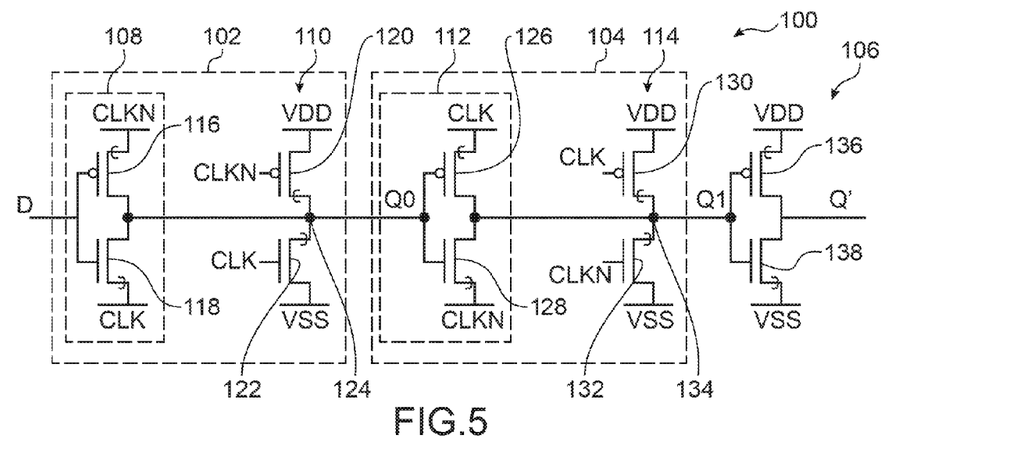
FIG. 5 shows a master-slave flip-flop according to a particular embodiment of the invention.

A master-slave flip-flop 100 according to a particular embodiment is shown in FIG. 5.

The flip-flop 100 comprises a first D latch 102 and a second D-latch 104. In the particular embodiment here described, the flip-flop 100 also comprises a first inverter 106 acting as an output driver. In a variant embodiment, the flip-flop 100 may not comprise this inverter 106.

The first D latch 102 comprises a first tri-state inverter 108 and a first latch 110. The second D latch 104 comprises a second tri-state inverter 112 and a second latch 114.

The first tri-state inverter 108 comprises a first p-TFET 116 and a first n-TFET 118. The drain of the first p-TFET 116 is connected to the drain of the first n-TFET 118 and to the output of the first tri-state inverter 108. A clock signal CLK, corresponding to a first control voltage, is applied on the source of the first n-TFET 118, and a complementary clock signal CLKN (that is having a high state value, e.g. between around 0.3 V and 0.6 V, when CLK signal has a low state value, e.g. around 0 V, and having low state value when CLK signal has a high state value), corresponding to a second control signal, is applied on the source of the first p-TFET 116. An input D of the flip-flop 100 is connected to the gates of the first p-TFET 116 and n-TFET 118.

In the symbols used to show the TFET, in all figures of this document, a square bracket is located on the source of the TFET. The square bracket may be drawn differently according to the convention which is chosen.

The first latch 110 comprises a second p-TFET 120 and a second n-TFET 122. The source of the second p-TFET 120 is connected to the source of the second n-TFET 122 which form a storage node 124 of the first latch 110. The electric potential of the storage node 124 is named Q0. The output of the first tri-state inverter 108 is connected to the storage node 124. A first supply voltage VDD, e.g. between around 0.3 V and 0.6 V, is applied on the drain of the second p-TFET 120 and a second supply voltage VSS, e.g. around 0 V and corresponding to the ground, is applied on the drain of the second n-TFET 122. The complementary clock signal CLKN is applied on the gate of the second p-TFET 120 and the clock signal CLK is applied on the gate of the second n-TFET 122.

Advantageously, the high state value of CLK is equal to the value of $V_{DD}$. In this case, a less number of supply voltages are required.

The second tri-state inverter 112 comprises similar elements as those of the first tri-state inverter 108, that is a first p-TFET 126 and a first n-TFET 128. The drain of the first p-TFET 126 is connected to the drain of the first n-TFET 128 which form the output of the second tri-state inverter 112. The clock signal CLK is applied on the source of the first p-TFET 126 and the complementary clock signal CLKN is applied on the source of the first n-TFET 128. The electric potential Q0 is applied on the gates of the first p-TFET 126 and n-TFET 128.

The second latch 114 comprises similar elements as those of the first latch 110, that is a second p-TFET 130 and a second n-TFET 132. The source of the second p-TFET 130 is connected to the source of the second n-TFET 132 which form a storage node 134 of the second latch 114. The electric potential of the storage node 134 is named Q1. The output of the second tri-state inverter 112 is connected to the storage node 134. The first supply voltage VDD is applied on the drain of the second p-TFET 130 and the second supply voltage VSS is applied on the drain of the second n-TFET 132. The clock signal CLK is applied on the gate of the second p-TFET 130 and the complementary clock signal CLKN is applied on the gate of the second n-TFET 132.

The inverter 106 has components and structure similar to those of tri-state inverters 108, 112. It comprises a third p-TFET 136 and a third n-TFET 138. The drain of the third p-TFET 136 is connected to the drain of the third n-TFET 138 which form the output of the inverter 106 which corresponds to the output of the master-slave flip-flop 100. The first supply voltage VDD is applied on the source of the third p-TFET 136 and the second supply voltage VSS is applied on the source of the third n-TFET 138. The electric potential Q1 is applied on the gates of the third p-TFET 136 and n-TFET 138. The behavior of the inverter 106 is such that the value of the electric potential obtained at the output of the inverter 106, named Q' (corresponding to the value of the electric potential on the drains of the third TFETs 136, 138) being complementary to the potential Q1 applied at the input of the inverter 106.

Figure 6:
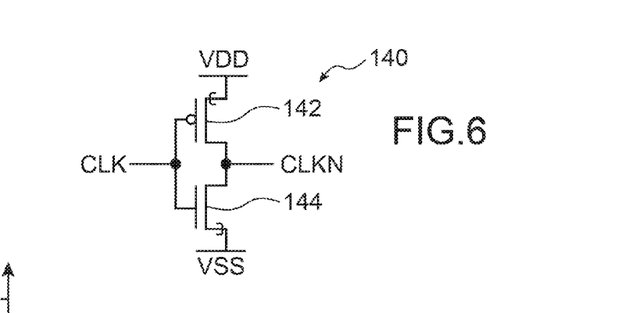
FIG. 6 shows a TFET inverter enabling to obtain a complementary clock signal used in the flip-flop according to a particular embodiment the invention.

The complementary clock signal CLKN may be obtained using another inverter 140 as shown in FIG. 6. This inverter 140 comprises a p-TFET 142 and a n-TFET 144 arranged and connected similarly to the third TFETs 136, 138 of the inverter 106.

When CLK has a value corresponding to the low state, the first n-TFET 118 and p-TFET 116 work as an inverter and the output of the first tri-state inverter 108 is at a complementary state that the input D. When CLK has a value corresponding to a high state, the first tri-state inverter 108 is tri-stated because the first n-TFET 118 and p-TFET 116 are reverse biased. Similarly, the second tri-state inverter 112 is tri-stated when CLK has a value corresponding to the low state and works as inverter when CLK has a value corresponding to the high state.

Figure 18:
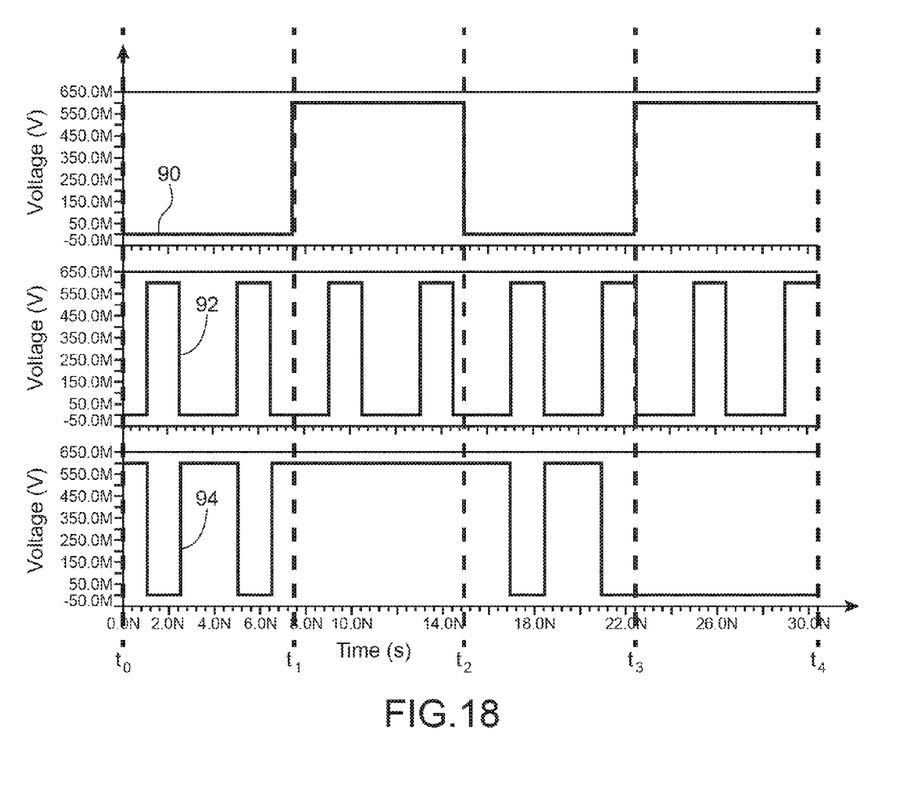
FIG. 18 shows waveforms of signals of the tri-state inverter according to a particular embodiment of the invention.

FIG. 18 shows the waveforms obtained within the first tri-state inverter 108. Reference 90 designates the clock signal CLK (with CLKN corresponding to the inverted CLK signal), reference 92 designates the signal applied on the input D, and reference 94 designates the signal obtained at the output of the tri-state inverter 108. On this figure, between times $t_0$ and $t_1$ and between times $t_2$ and $t_3$, the tri-state inverter 108 works as an inverter. Between times $t_1$ and $t_2$ and between times $t_3$ and $t_4$, the tri-state inverter 108 is tri-stated, that is in a state wherein the output is insulted from the input, the value of the output signal being uncorrelated from that of the input signal.

The first D latch 102 forms a master latch of the flip-flop 100 and the second D latch 104 forms a slave latch of the flip-flop 100.

These master and slave latches are implemented using NDR (Negative Differential Resistance) property of TFETs which is explained in the document US 2011/0299326 A1.

Figure 7:
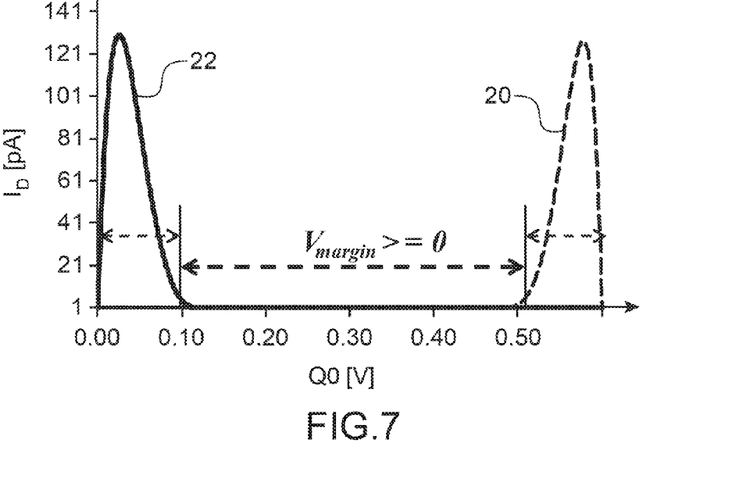
FIG. 7 shows the characteristic $I_D(V_{Q0})$ with reverse bias $V_{DS}$ for the n-TFET and the p-TFET of a latch of the flip-flop according to a particular embodiment the invention.

The characteristic $I_D(V_{Q0})$ with reverse bias $V_{DS}$ for the p-TFET 120 (curve 20) and the n-TFET 122 (curve 22) of the first latch 110 is shown in FIG. 7, with $V_{DD}-V_{SS}=0.6$ V (for example obtained with $V_{SS}=0$ V and $V_{DD}=0.6$ V, or with $V_{SS}=-0.3$ V and $V_{DD}=0.3$ V). This characteristic shows that reverse biased n-TFET 122 and p-TFET 120 with such supply voltages have a behavior similar to a latch behavior, with the condition that the total latch supply ($V_{DD}-V_{SD}$) is less than the critical point where the TFET current becomes independent of gate voltage (corresponding to the region III shown in FIG. 2 where the charge injection mechanisms in the TFET are dominated by the thermionic emission over the barrier). In the example described here, this point is equal to around 0.6 V. Thus, if $V_{SS}=0$ V, $V_{DD}$ is chosen 0.6 V. The value of the high state of CLK is kept high in order to get sufficient gate drive to generate current hump for both TFETs 120, 122.

Since the second n-TFET 122 conducts when $V_{Q0}$ is close to $V_{SS}$ and the second p-TFET 120 conducts when $V_{Q0}$ is close to $V_{DD}$, a '0' value, or low state value, is stored in the first latch 110 on the second n-TFET 122, with the second p-TFET 120 in OFF state in this case, and a '1' value, or high state value, is stored in the first latch 110 on the second p-TFET 120, with the second n-TFET 122 in OFF state in this case. For a total supply voltage ($V_{DD}-V_{SD}$) of 0.6 V, the storage node 124 is discharged through the second n-TFET 122 for 0<Q0<100 mV (range corresponding to the width of the hump, region I, of the characteristic $I_D(V_{DS})$ 22 of the n-TFET 122) till Q0=$V_{SS}$, that is here Q0=0 V. Similarly, Q0 is charged to the value of $V_{DD}$ by the p-TFET 120 for 0.5 V<Q0<0.6 V (range corresponding to the width of the hump, region I, of the characteristic $I_D(V_{DS})$ 20 of the p-TFET 120).

The distance between the two humps of the characteristics $I_D(V_{DS})$ of the second TFETs 120, 122 is called $V_{Margin}$ and corresponds to the voltage range for which the first latch 110 is metastable. Here, the features of the second TFETs 120, 122 and the values of $V_{DD}$ and $V_{SS}$ are such that $V_{Margin} \geq 0$.

The current peak value obtained at the top of the humps of the characteristics $I_D(V_{DS})$ of the second TFETs 120, 122 varies with the applied gate voltage (CLK and CLKN) but the width of the hump remains fairly independent of gate voltage, as shown in FIG. 2.

The behavior of the second latch 114 is similar to that above explained for the first latch 110, except concerning the applied gate voltages which are complementary to those applied on the gates of the second TFETs 120, 122 of the first latch 110.

Figure 8:
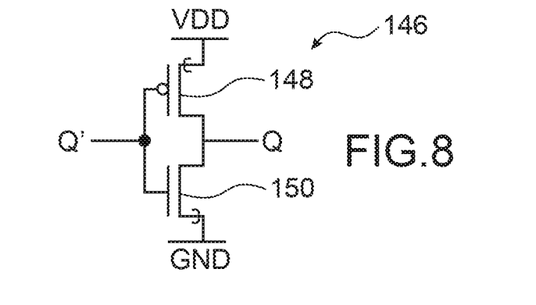
FIG. 8 shows an optional output driver for the flip-flop according to a particular embodiment of the invention.

The inverter 106 is used to isolate the internal storage latch from outside fan-out. As the value Q' obtained at the output of the master-slave flip-flop 100 is complementary to that of Q1 (because of the behavior of the inverter 106), the master-slave flip-flop may comprise a second inverter 146 having an input on which Q' is applied (that is having its input connected to the output of the inverter 106) and outputting a value Q corresponding to that of Q1, as shown in FIG. 8. This second inverter 146 comprises a fourth p-TFET 148 and a fourth n-TFET 150 arranged and connected similarly to the third TFETs 136, 138 of the inverter 106. The output of the master-slave flip-flop 106 thus corresponds to the output of the second inverter 146.

Figure 9:
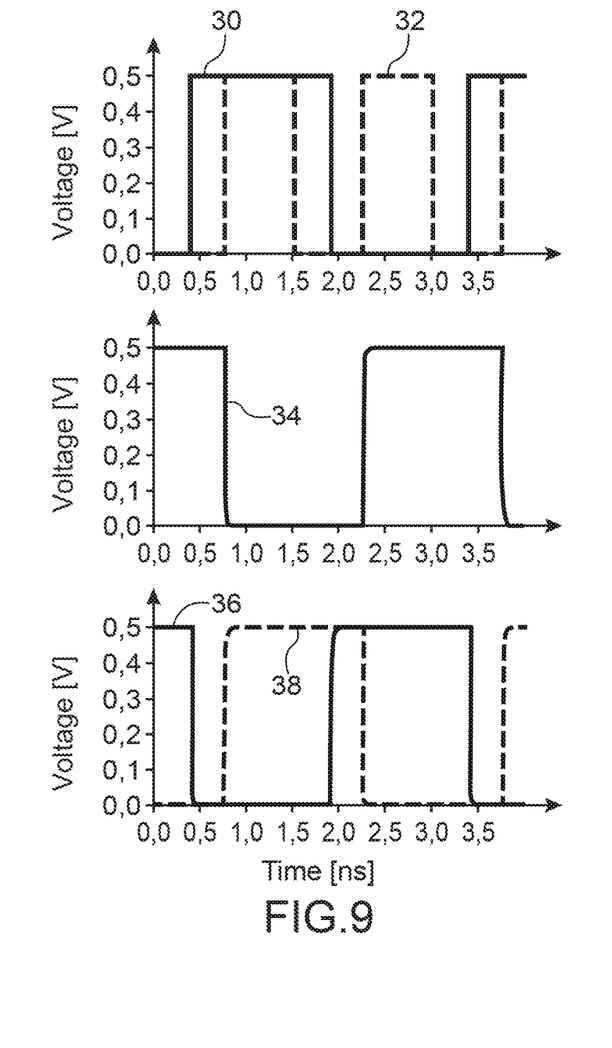
FIG. 9 shows waveforms of signals of the flip-flop according to a particular embodiment of the invention.

Behavior of the flip-flop 100 and its internal nodes for data and clock transitions is shown in FIG. 9. The signal D is referenced 30, the signal CLK is referenced 32, the potential Q' is referenced 34, the potential Q0 is referenced 36 and the potential Q1 is referenced 38.

Concerning the behavior of the flip-flop 100, when CLK is low, D is complemented by the first tri-state inverter 108. The first latch 110 (master) and the second tri-state inverter 112 on 01 are tri-stated. Q1 value is preserved by the second latch 114 and outputs (Q' or Q) are driven by inverters 106, 146. When CLK is high, the first tri-state inverter 108 is tri-stated and the first latch 110 is preserving the value on Q0 and driving Q1 using the second tri-state inverter 112. During this period, the second latch 114 is tri-stated.

The flip-flop 100 shown in FIG. 5 works as a positive edge triggered flip-flop. By swapping CLK and CLKN connections for master and slave latches 110, 114, the obtained flip-flop works as a negative edge triggered flip-flop.

For simulation purpose, a constant fan-out of 4 inverters has been considered. The master-slave flip-flop 100 is simulated using the table models above explained. For comparison purpose, standard industrial master slave flip-flop is implemented in 28 nm CMOS, 22 nm low standby power (LSTP) FinFETs and 22 nm high performance (HP) FinFETs using PTM models. Measurements for different parameters, like setup time, power and clock-to-Q delay are performed with similar constraints for all designs. The analysis is done for voltage range ($V_{DD}$–$V_{SS}$) from 0.3 V to 0.6V, which is suitable for the proposed design and its use-cases.

Figure 10:
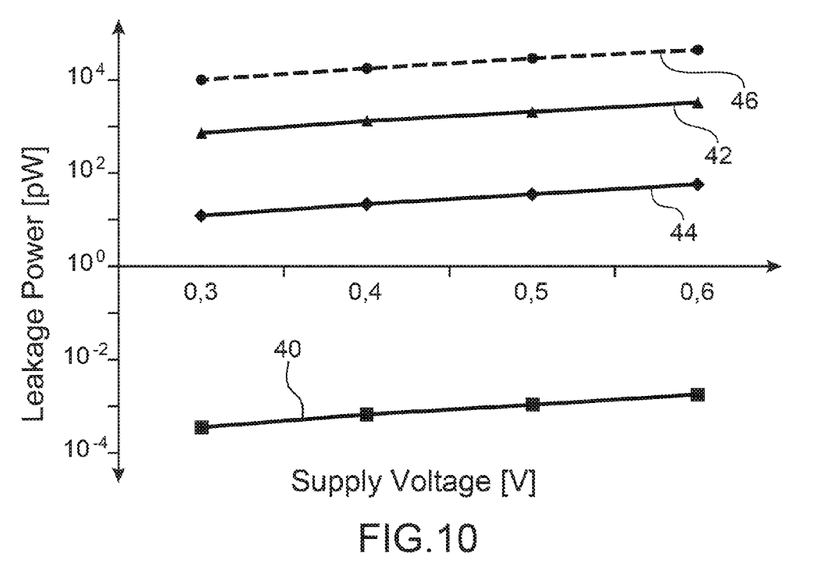
FIG. 10 shows the leakage power obtained with the flip-flop according to a particular embodiment of the invention and with other flip-flops of the prior art.

FIG. 10 shows the leakage power consumption for the master-slave flip-flop 100 (curve 40), CMOS flip-flop (curve 42), LSTP FinFETs flip-flop (curve 44) and HP FinFETs flip-flop (curve 46). This figure shows that the static power consumption of the master-slave flip-flop 100 is reduced by 4 to 7 decades in comparison to CMOS and FinFET designs.

Figure 11:
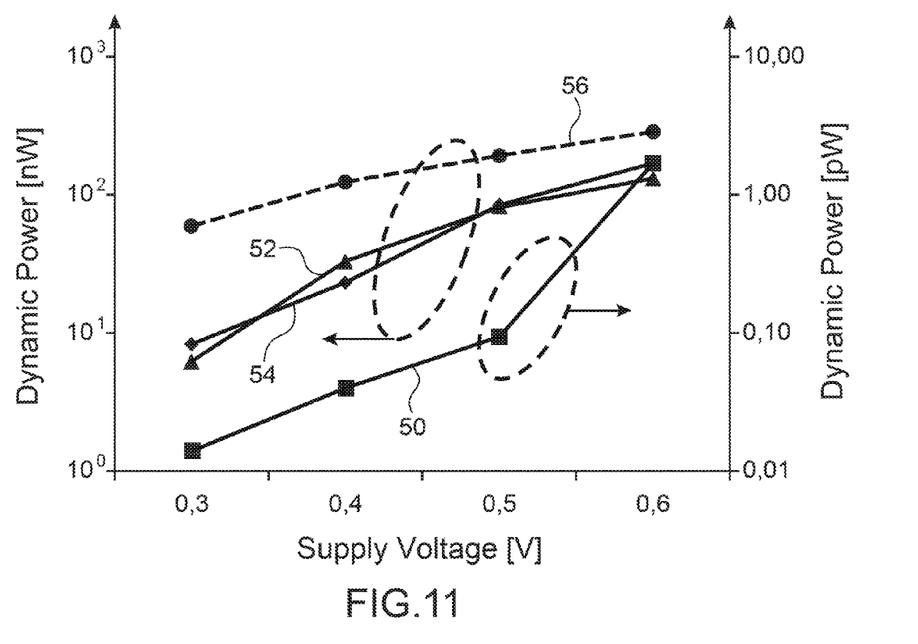
FIG. 11 shows the dynamic power consumption of the flip-flop according to a particular embodiment of the invention and of other flip-flops of the prior art.

The dynamic power consumption for the same flip-flop designs is shown in FIG. 11 (curve 50 for the master-slave flip-flop 100, curve 52 for the CMOS flip-flop, curve 54 for the LSTP FinFETs flip-flop and curve 56 for the HP FinFETs flip-flop). The flip-flop internal nodes capacitance for the master-slave flip-flop 100 is much less than in the CMOS and FinFET flip-flops because of lower number of transistors. Thus, dynamic power consumption for the master-slave flip-flop 100 is 3 to 5 decade better than that of CMOS and FinFET designs.

Figure 12:
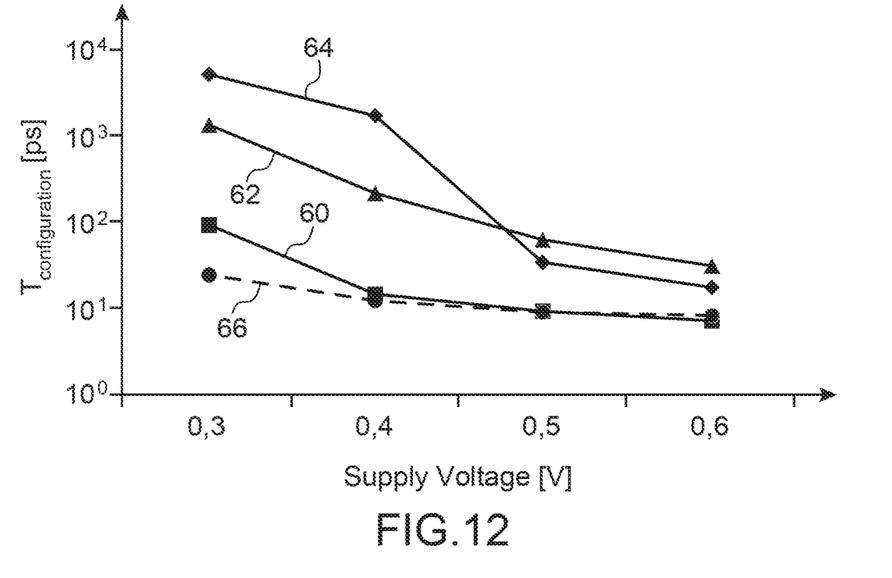
FIG. 12 shows the setup time obtained for the flip-flop according to a particular embodiment of the invention and for other flip-flops of the prior art.

FIG. 12 shows the setup time requirement for the same flip-flop designs (curve 60 for the master-slave flip-flop 100, curve 62 for the CMOS flip-flop, curve 64 for the LSTP FinFETs flip-flop and curve 66 for the HP FinFETs flip-flop). It should be noted that the master-slave flip-flop 100 is faster than CMOS and FinFET-LSTP flip-flops for supply voltage range of 0.3 V to 0.6 V. However, the setup requirement is almost similar to that of the HP FinFETs flip-flop which is overall fastest but also the most power consuming.

At 0.3 V supply, setup time of proposed design is 14.6× and 56× lower in comparison to CMOS and FinFET-LSTP designs, respectively. However, the setup time is still 3.75× larger than that of the FinFET-HP flip-flop at 0.3 V supply voltage.

Figure 13:
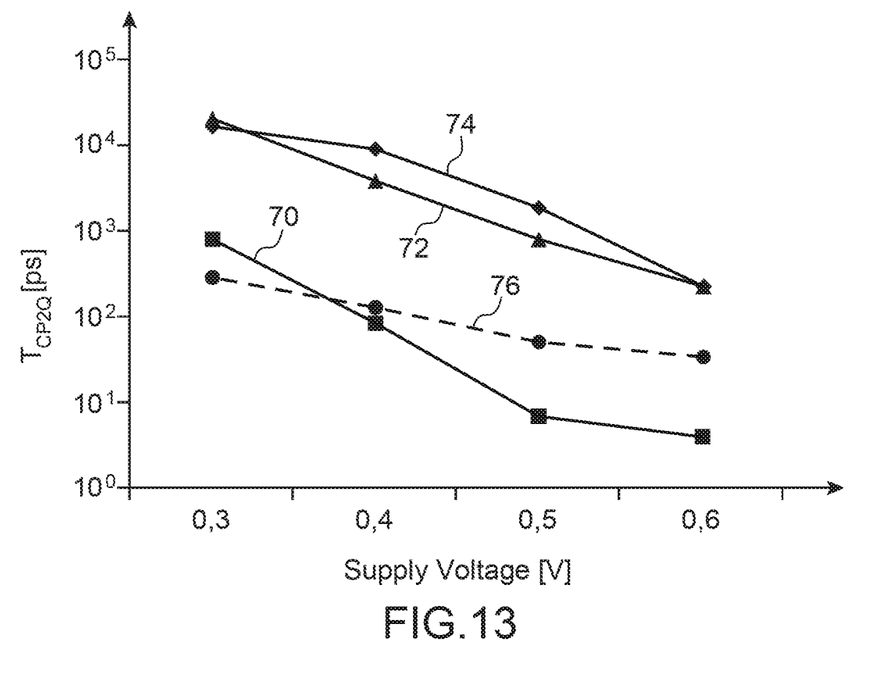
FIG. 13 shows the clock to output propagation delay obtained for the flip-flop according to a particular embodiment of the invention and for other flip-flops of the prior art.

FIG. 13 shows the clock to output propagation delay ($T_{CP2Q}$) for the same flip-flop designs (curve 70 for the master-slave flip-flop 100, curve 72 for the CMOS flip-flop, curve 74 for the LSTP FinFETs flip-flop and curve 76 for the HP FinFETs flip-flop). Due to lower number of delay elements in clock to output path and lower capacitance, the $T_{CP2Q}$ is significantly reduced for the flip-flop 100. $T_{CP2Q}$ is 20× to 58× lower than in CMOS and FinFET-LSTP designs, respectively. For sub-0.4 V operation, $T_{CP2Q}$ is 8× better for FinFET-HP flip-flop at the cost of $10^7$× more leakage power consumption in comparison to the TFET flip-flop 100.

Hold time for the master-slave flip-flop 100 and for the other above described master-slave flip-flop is dominated by the delay of the inverter on CLK to generate CLKN. Therefore, it is similar for all the implemented designs.

Figure 14:
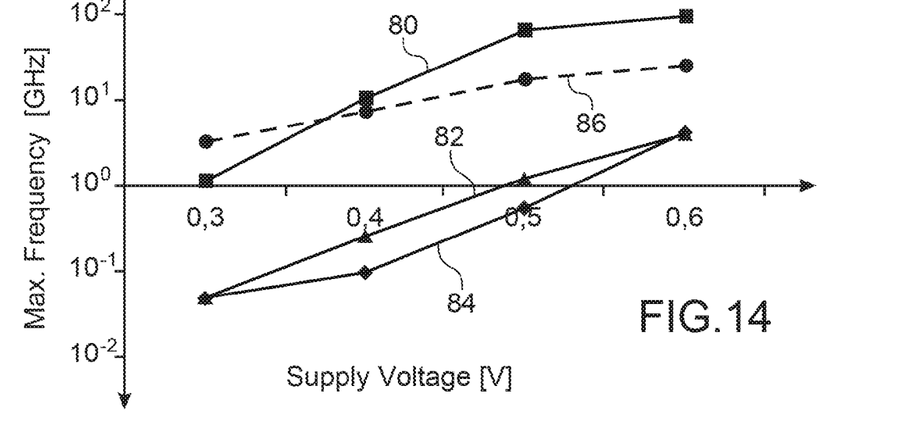
FIG. 14 shows the maximum operating frequency obtained for the flip-flop according to a particular embodiment of the invention and for the other flip-flops of the prior art.

The maximum speed of operation for flip-flop is limited by the setup time and clock to output propagation delay. FIG. 14 shows the theoretical limit of operating frequency, defined as $1/(T_{setup}+T_{CP2Q})$, vs. supply voltage for the different flip-flop designs (curve 80 for the master-slave flip-flop 100, curve 82 for the CMOS flip-flop, curve 84 for the LSTP FinFETs flip-flop and curve 86 for the HP FinFETs flip-flop). Up-to 23× improvement is achieved for the master-slave flip-flop 100 in comparison to CMOS and FinFET-LSTP designs.

The table below indicates the number of transistor required for the master-slave flip-flop 100 and other flip-flops of the prior art:

| Flip-flop architecture | Transistor Count |
| --- | --- |
| TFET flip-flop 100 | 12 with the output driver 106 |
|  | 14 with the output drivers 106, 146 |
| Transmission Gate | 24 |
| C²MOS (C²MOSFF) | 24 |
| Semi-Dynamic (SDFF) | 23 |
| Sense Amp (SAFF) | 18 or 19 |
| Modified Sense Amp (MSAFF) | 26 or 27 |
| Pseudo Static DFF (DFF) | 14 or 18 |

The above table shows that the master-slave flip-flop 100 needs less transistors than all flip-flops of prior art.

Reduced leakage is obtained with the master-slave flip-flop 100 in comparison to CMOS and FinFET implementations due to ultra-low leakage of TFET used in the master-slave flip-flop 100 ($I_{OFF} \approx 10^{-14}$ A/μm). In the master-slave flip-flop 100, more than half of the TFETs are always with reverse $V_{DS}$ where leakage is at its minimum and is independent of $V_{GS}$. This combined with a device optimized for leakage results in the lowest static power consumption among all the implementations of the prior art.

Figure 15:
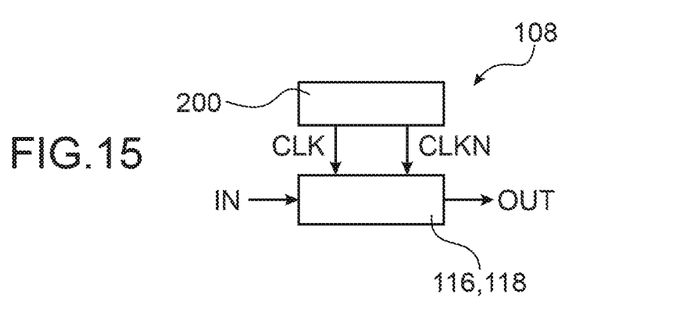
FIG. 15 shows a tri-state inverter according to a particular embodiment of the invention.

The tri-state inverter 108, or the tri-state inverter 112, can be used with elements which are different than those corresponding to the elements of the master-slave flip-flop 100. As shown in FIG. 15, the tri-state inverter 108 comprises a control circuit 200 providing the control voltages CLK and CLKN to the first TFETs 116, 118. This control circuit 200 may produce the signal CLKN thanks to the inverter 140 previously disclosed with the FIG. 6. The signal applied on the input of the tri-state inverter (that is applied on the gates of the first TFETs 116, 118) is named 'IN' and the signal outputted by the tri-state inverter 108 (corresponding to that obtained on the drains of the first TFETs 116, 118) is named 'OUT'.

Figure 16:
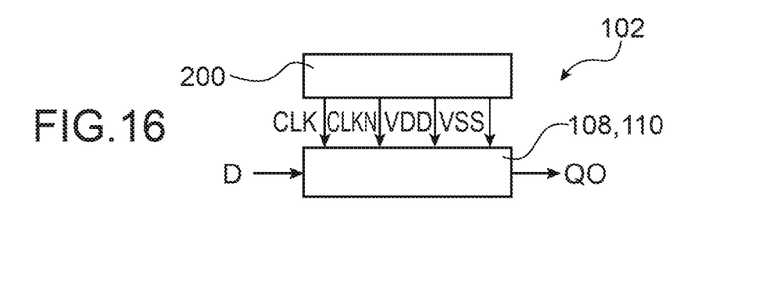
FIG. 16 shows a D latch according to a particular embodiment of the invention.

Similarly, the D latch 102, or the D latch 104, can be used with elements which are different than those corresponding to the elements of the master-slave flip-flop 100. As shown in FIG. 16, the D latch 102 comprises the control circuit 200 providing the signals CLK and CLKN to the first TFETs 116, 118 and to the second TFETs 120, 122, and also the supply voltages VDD and VSS to the second TFETs 120, 122.

Figure 17:
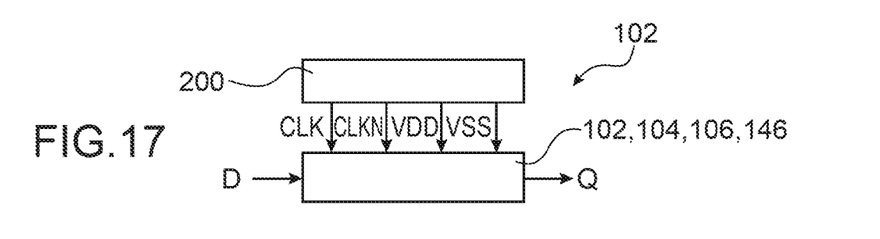
FIG. 17 shows a master-slave flip-flop according to a particular embodiment of the invention.

FIG. 17 shows the master-slave flip-flop 100 comprising the control circuit 200 providing the signals CLK and CLKN and the supply voltages VDD and VSS to the TFETS of the flip-flop 100.

To provide CLK and CLKN, the control circuit 200 can comprise the inverter 140 previously described in relation with FIG. 6, wherein the CLK signal corresponds to a clock signal received on an input of the control circuit 200. As a variant, it is possible that the control circuit comprises two inverters, each one being similar to the inverter 140. In this case, the clock signal is applied on the gates of the two TFETs of the first inverter. The output of the second inverter (on which CLKN is obtained) is connected to the gates of the two TFETs of the second inverter and the signal CLK corresponds to the signal obtained on the output of the second inverter.

The flip-flops 100 previously described may comprise additional elements to support a test mode and set/reset function as in standard flip-flop. The document US 2015/0039956 A1 discloses for example such elements.

In the above description, the data concerning the leakage, area, power and speed are experimental results which can change with different sizing, implementation and technologies. In addition, the different example values given for the different voltages can be different according to the sizing, implementation and technologies used.

The invention claimed is:

1. A D latch comprising at least:
one tri-state inverter, an input of the tri-state inverter corresponding to an input of the D latch, the tri-state inverter including
a first n-TFET (Tunnel Field-Effect Transistor) and a first p-TFET, a drain of the first n-TFET being connected to a drain of the first p-TFET and to an output of the tri-state inverter, gates of the first n-TFET and first p-TFET being connected to the input of the tri-state inverter, and
a control circuit configured to apply a first control voltage on a source of the first n-TFET and a second control voltage on a source of the first p-TFET, values of the first and second control voltages being positive or zero, the control circuit being configured to control the values of the first and second control voltages such that, when the tri-state inverter functions as an inverter, the value of the first control voltage is lower than the value of the second control voltage, and when the tri-state inverter is tri-stated, the value of the first control voltage is higher than the value of the second control voltage such that the output of the tri-state inverter is insulated from the input of the tri-state inverter; and
a latch comprising a second n-TFET, a second p-TFET and a storage node formed by connection of a source of the second n-TFET to a source of the second p-TFET, an output of the D latch being connected to the storage node of the latch,
wherein the control circuit is configured to apply:
the first control voltage on a gate of one of the second n-TFET and p-TFET, and the second control voltage on a gate of the other one of the second n-TFET and p-TFET,
a first supply voltage on a drain of the second p-TFET and a second supply voltage on a drain of the second n-TFET, and
wherein the first and second supply voltages are such that the second n-TFET and p-TFET are reverse biased in a state wherein a conduction current is obtainable by band-to-band tunneling in the second n-TFET and p-TFET.

2. The D latch according to claim 1, wherein a difference between the values of the first and second supply voltages is less than around 0.6 V.

3. A master-slave flip-flop comprising:
at least first and second D latches, each of the first and second D latches including
one tri-state inverter an input of the tri-state inverter corresponding to an input of the D latch, the tri-state inverter including
a first n-TFET (Tunnel Field-Effect Transistor) and a first p-TFET, a drain of the first n-TFET being connected to a drain of the first p-TFET and to an output of the tri-state inverter, gates of the first n-TFET and first p-TFET being connected to the input of the tri-state inverter, and
a control circuit configured to apply a first control voltage on a source of the first n-TFET and a second control voltage on a source of the first p-TFET, values of the first and second control voltages being positive or zero, the control circuit being configured to control the values of the first and second control voltages such that, when the tri-state inverter functions as an inverter, the value of the first control voltage is lower than the value of the second control voltage, and when the tri-state inverter is tri-stated, the value of the first control voltage is higher than the value of the second control voltage such that the output of the tri-state inverter is insulated from the input of the tri-state inverter, and
a latch comprising a second n-TFET, a second p-TFET and a storage node formed by connection of a source of the second n-TFET to a source of the second p-TFET, an output of the D latch being connected to the storage node of the latch, wherein
the control circuit is configured to apply:
the first control voltage on a gate of one of the second n-TFET and p-TFET, and the second control voltage on a gate of the other one of the second n-TFET and p-TFET;
a first supply voltage on a drain of the second p-TFET and a second supply voltage on a drain of the second n-TFET,
the first and second supply voltages are such that the second n-TFET and p-TFET are reverse biased in a state wherein a conduction current is obtainable by band-to-band tunneling in the second n-TFET and p-TFET,
the output of the first D latch is connected to the input of the second D latch,
the input of the first D latch corresponds to an input of the master-slave flip-flop,
an output of the master-slave flip-flop is connected to the output of the second D latch,
the value of the first control voltage applied in the first D latch is equal to the value of the second control voltage applied in the second D latch, and
the value of the second control voltage applied in the first D latch is equal to the value of the first control voltage applied in the second D latch.

4. The master-slave flip-flop according to claim 3, wherein:

the first control voltage applied in the first D latch and the second control voltage applied in the second D latch is a first clock signal oscillating between a high state and a low state; and the second control voltage applied in the first D latch and the first control voltage applied in the second D latch is a second clock signal which is complementary to the first clock signal.

5. The master-slave flip-flop according to claim 3, further comprising a first inverter including at least a third n-TFET and a third p-TFET, a drain of said third n-TFET being connected to a drain of said third p-TFET and to an output of the first inverter, gates of said third n-TFET and third p-TFET being connected to an input of the first inverter which is connected to the output of the second D latch, and wherein the control circuit is configured to apply the first supply voltage on a source of said third p-TFET and the second supply voltage on a source of said third n-TFET.

6. The master-slave flip-flop according to claim 5, further comprising a second inverter including at least a fourth n-TFET and a fourth p-TFET, a drain of said fourth n-TFET being connected to a drain of said fourth p-TFET and to an output of the second inverter, gates of said fourth n-TFET and fourth p-TFET being connected to an input of the second inverter which is connected to the output of the first inverter, and wherein the control circuit is configured to apply the first supply voltage on a source of said fourth p-TFET and the second supply voltage on a source of said fourth n-TFET.

7. The master-slave flip-flop according to claim 3, wherein, in each of the first and second D latches, the first control voltage is applied on the gate of the second n-TFET and the second control voltage is applied on the gate of the second p-TFET.

8. The master-slave flip-flop according to claim 3, wherein, in each of the first and second D latches, the first control voltage is applied on the gate of the second p-TFET and the second control voltage is applied on the gate of the second n-TFET.

9. The D latch according to claim 1, wherein the first control voltage is a first clock signal oscillating between a high state and a low state, and the second control voltage is a second clock signal which is complementary to the first clock signal.

10. The D latch according to claim 1, wherein:

when the value of first control voltage is higher than the value of the second control voltage, the value of the first control voltage is between around 0.3 V and 0.6 V and the value of the second control voltage is equal to around 0 V, and when the values of first control voltage is lower than the value of the second control voltage, the value of the second control voltage is between around 0.3 V and 0.6 V and the value of the first control voltage is equal to around 0 V.

* * * * *